United States Patent [19]
Togo

[11] Patent Number: 6,063,694
[45] Date of Patent: May 16, 2000

[54] FIELD-EFFECT TRANSISTOR WITH A TRENCH ISOLATION STRUCTURE AND A METHOD FOR MANUFACTURING THE SAME

[75] Inventor: Mitsuhiro Togo, Tokyo, Japan

[73] Assignee: NEC Corporation, Tokyo, Japan

[21] Appl. No.: 09/164,335

[22] Filed: Oct. 1, 1998

[30] Foreign Application Priority Data

Oct. 1, 1997 [JP] Japan ................................ 9-268713

[51] Int. Cl.⁷ .................................................. H01L 21/76
[52] U.S. Cl. .......................... 438/440; 438/424; 438/425; 438/296
[58] Field of Search .................. 438/440, 421, 438/424, 425, 296

[56] References Cited

U.S. PATENT DOCUMENTS

| | | | |
|---|---|---|---|
| 4,374,011 | 2/1983 | Vora et al. | 438/424 |
| 4,580,331 | 4/1986 | Socolf | 438/221 |
| 5,130,268 | 7/1992 | Liou et al. | 438/425 |
| 5,258,332 | 11/1993 | Horika et al. | 438/424 |
| 5,372,951 | 12/1994 | Anjum et al. | 438/440 |
| 5,525,540 | 6/1996 | Zenke et al. | 438/221 |
| 5,561,073 | 10/1996 | Jerome et al. | 438/426 |
| 5,578,509 | 11/1996 | Fujita | 438/286 |
| 5,643,822 | 7/1997 | Furukawa et al. | 438/421 |
| 5,677,229 | 10/1997 | Morita et al. | 438/424 |
| 5,728,614 | 3/1998 | Tseng | 438/225 |
| 5,733,383 | 3/1998 | Fazan et al. | 438/424 |
| 5,741,738 | 4/1998 | Mandelman et al. | 438/296 |
| 5,780,346 | 7/1998 | Arghavani et al. | 438/296 |
| 5,795,811 | 8/1998 | Kim et al. | 438/404 |
| 5,811,347 | 9/1998 | Gardner et al. | 438/424 |
| 5,874,346 | 2/1999 | Fulford, Jr. et al. | 438/221 |
| 5,891,787 | 4/1999 | Gardner et al. | 438/424 |
| 5,940,718 | 8/1999 | Ibok et al. | 438/440 |

FOREIGN PATENT DOCUMENTS

| | | |
|---|---|---|
| 4-206774 | 7/1992 | Japan . |
| 7-94503 | 4/1995 | Japan . |
| 7-240409 | 9/1995 | Japan . |

OTHER PUBLICATIONS

C.T. Liu, et al., "25Å Gate Oxide Without Boron Penetration For 0.25 and 0.3–μm PMOSFETs", IEEE, 1996 Symposium on VLSI Technology Digest of Technical Paper, Jul. 1996, pp. 18 and 19.

Extended Abstracts (The 58th Autumn Meeting, 1997); The Japan Society of Applied Physics, 1997, No. 2, JSAP Catalog No.: AP971120–02.

*Primary Examiner*—Charles Bowers
*Assistant Examiner*—David S Blum
*Attorney, Agent, or Firm*—Young & Thompson

[57] ABSTRACT

Into the portion of a silicon substrate which lies in the vicinity of a trench isolation portion, ions such as argon for enhancing the oxidation rate are implanted. Or, nitrogen ions for lowering the oxidation rate are implanted into the portion of the silicon substrate other than the portion thereof lying in the vicinity of the trench isolation portion. Thereafter, thermal oxidation is performed, so that a gate insulation film is formed in such a manner that the thickness thereof becomes equal to or greater than the thickness of the center portion thereof. Thus, the deterioration of the breakdown voltage of the insulation film can be prevented, because the gate insulation film becomes thin in the end portion of the gate electrode.

6 Claims, 11 Drawing Sheets

FIELD-EFFECT TRANSISTOR WITH A TRENCH ISOLATION STRUCTURE AND A METHOD FOR MANUFACTURING THE SAME

BACKGROUND OF THE INVENTION

1. Field of the Invention

The present invention relates to a field-effect transistor with a trench isolation structure and a method for the manufacturing the same and, more specifically, a field-effect transistor with a field insulation film formed by the use of the LOCOS method and a field-effect transistor with a trench isolation structure such as, e.g., a trench DRAM cell, and the present invention also relates to a method for manufacturing the above-mentioned field-effect transistors.

2. Related Art

Figure 1A:
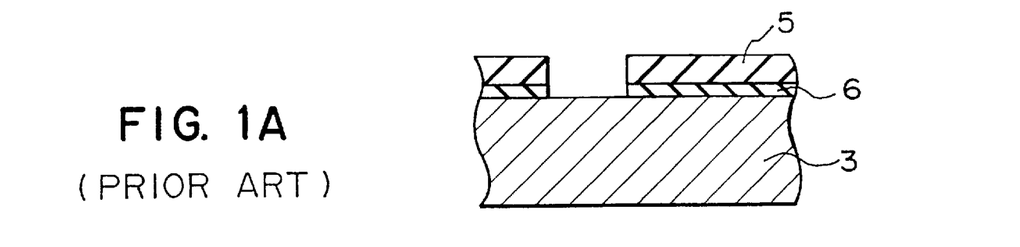
FIGS. 1A to 1E are sectional views showing, in the order of manufacturing steps, the conventional method for the manufacturing of a field-effect transistor with a trench isolation structure.

In the case of forming an element isolation region of a semiconductor device, the trench isolation method suited for microstructuring has so far been used. FIGS. 1A to 1E are sectional views showing this trench isolation method in the order of the manufacturing steps thereof. As shown in FIG. 1A, a silicon oxide film 6 is formed on a silicon substrate 3, and a silicon nitride film 5 is formed on this silicon oxide film 6. Further, those portions of the silicon oxide film 6 and the silicon nitride film 5 which lie at the position at which a trench isolation portion is to be formed are selectively removed.

Figure 1B:
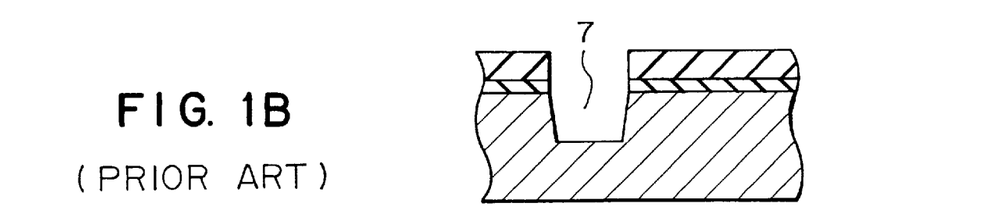

Further, as shown in FIG. 1B, by the use of the silicon nitride film 5 and the silicon oxide film 6 as a mask, the silicon substrate 3 is etched to thereby form a trench 7 in the silicon substrate 3.

Figure 1C:
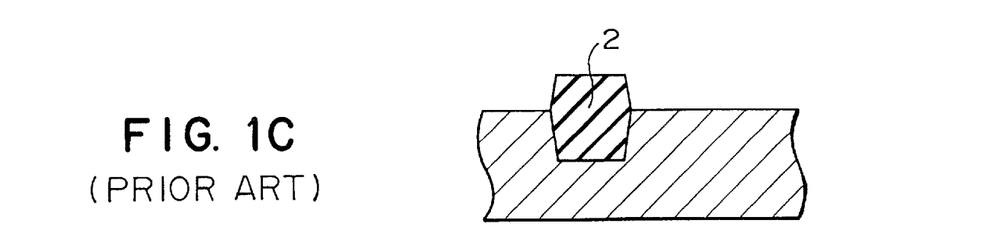

Thereafter, as shown in FIG. 1C, the silicon nitride film 5 and the silicon oxide film 6 are removed, and then, an insulation film 2 for element separation is formed in a state buried in the trench 7.

Figure 1D:
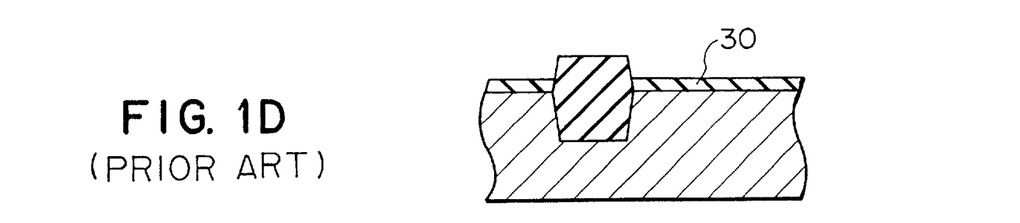
Figure 1E:
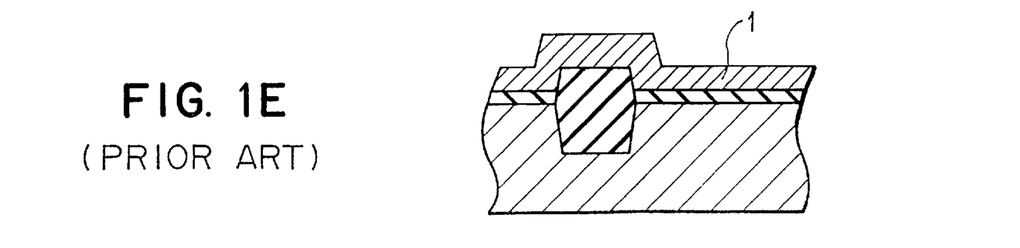

Subsequently, as shown in FIG. 1D, an oxide film 30 is formed over the whole surface, and thereafter, a gate electrode film 1 is formed over the whole surface as shown in FIG. 1E.

Further, there is pointed out an element isolation method based on the LOCOS (LOCAL OXIDATION OF SILICON) method which is less suited, than the trench isolation method, for microstructuring but comprises simpler manufacturing steps.

Figure 2A:
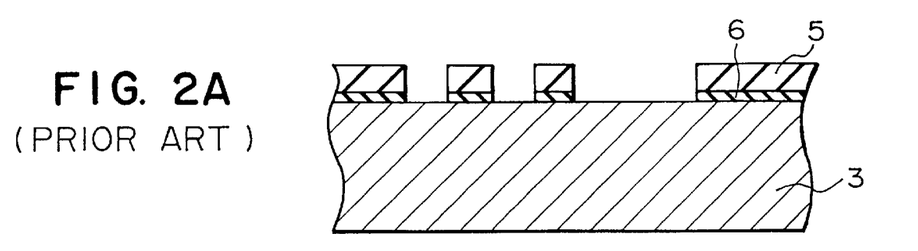
FIGS. 2A to 2D are sectional views showing, in the order of manufacturing steps, the conventional method for manufacturing a field-effect transistor with a field insulation film formed by the use of the LOCOS method.

FIGS. 2A to 2D are sectional views showing, in the order of manufacturing steps, the element isolation method based on this LOCOS method. As shown in FIG. 2A, on a silicon substrate 3, silicon oxide film 6 and a silicon nitride film 5 are formed, and those portions of the silicon oxide film 6 and the silicon nitride film 5 which lie at the positions at which element isolation portions are to be formed are selectively removed to expose the surface of the substrate.

Figure 2B:
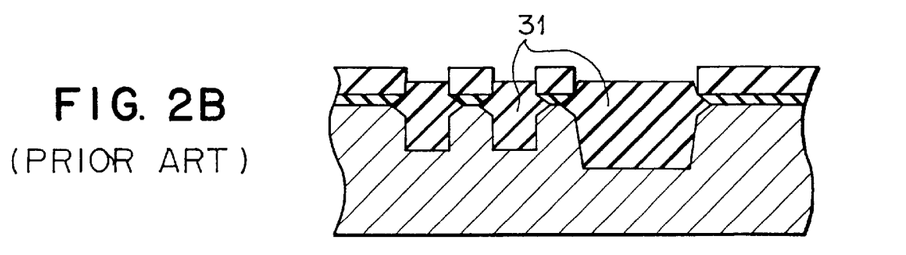

Subsequently, as shown in FIG. 2B, the surface of the substrate is oxidized by using the silicon nitride film 5 as a mask, whereby a silicon oxide film 31 is formed on the substrate surface, which film is used as element isolation portions.

Figure 2C:
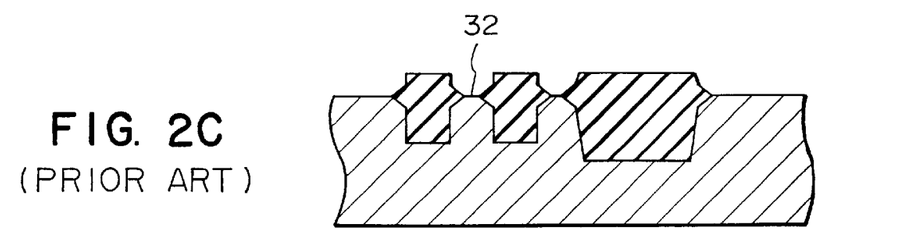

Thereafter, as shown in FIG. 2C, the silicon oxide film 6 and the silicon nitride film 5 are removed, and element regions 32 are formed between the portions of the silicon oxide film 31.

Figure 2D:
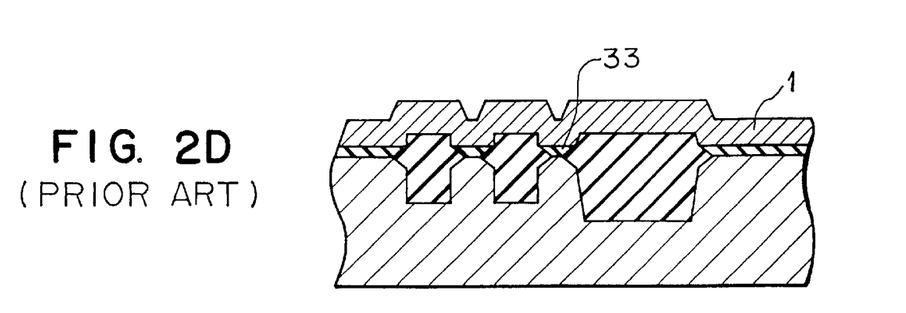

Subsequently, as shown in FIG. 2D, gate insulation films 33 are formed, and thereafter, a gate electrode film 1 is formed.

In the case of forming an insulation film by oxidation as stated above, when no pattern of, e.g., an insulation film exists on the silicon substrate, oxygen is uniformly fed from the surface of the silicon substrate, whereby an oxide film with a uniform thickness is formed. However, in case the pattern of an insulation film exists on the silicon substrate, the feed of oxygen from the surface of the silicon substrate is not effected uniformly, and thus, the portion of the oxide film which lies in the vicinity of the end of said pattern becomes thin.

Figure 3A:
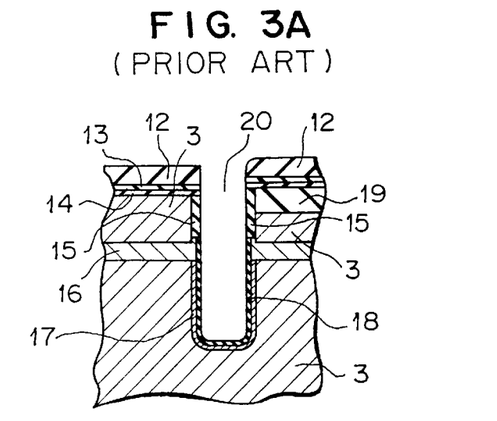
FIGS. 3A to 3F are sectional views showing the conventional method for forming a trench cell structure in the order of the manufacturing steps thereof.

FIGS. 3A to 3F are sectional views showing the method for manufacturing a trench DRAM in the order of the manufacturing steps thereof. As shown in FIG. 3A, a substrate plate electrode 16 is formed on the surface of a silicon substrate 3, and further, a field insulation film 19, a silicon oxide film 14, a silicon nitride film 13 and a silicon oxide film 12 are formed. Thereafter, a trench 20 is formed, and, in that portion of the inner surface of said trench 20 which lies below the substrate plate electrode 16, a capacitance electrode 17 and a capacitance insulation film 18 are formed by lamination or stacking, and, on the side surface of the field insulation film 19, a silicon oxide film 15 is formed.

Figure 3B:
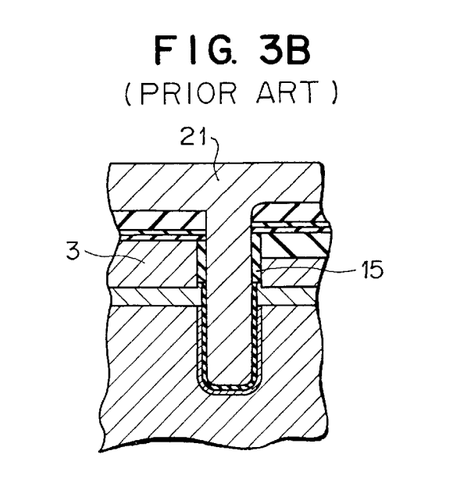
Figure 3C:
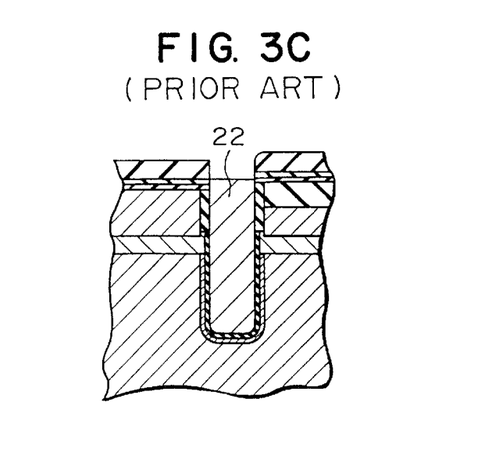

Subsequently, as shown in FIG. 3B, a silicon film 21 is formed in a state buried in the trench 20, and, as shown in FIG. 3C, the portion of the silicon film 21 which lies on the silicon oxide film 12 is removed. As a result, a storage electrode made of the silicon film 22 formed of silicon is left in the trench 20.

Figure 3D:
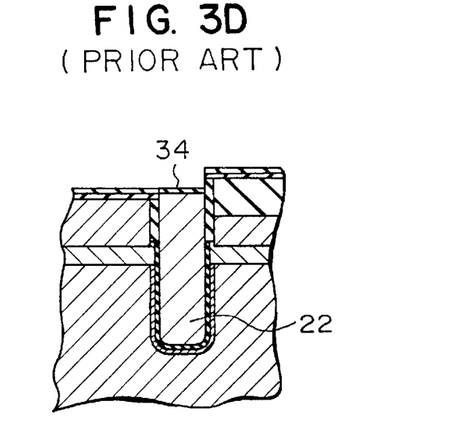

Next, as shown in FIG. 3D, the silicon oxide film 12 is removed, and thereafter, in order to isolate the storage electrode made of the silicon film 22 formed of silicon which contains an impurity from a gate electrode made of the silicon film 22 of a transfer gate of the adjacent cell, the upper portion of the storage electrode 24 is oxidized to form an oxide film 34.

Figure 3E:
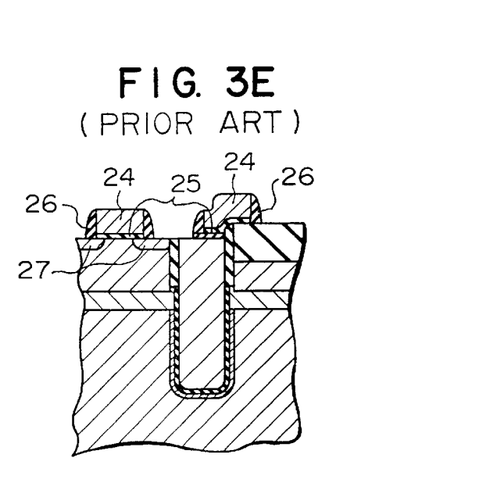

Thereafter, as shown in FIG. 3E, the silicon nitride film 13 and the silicon oxide film 14 are removed, and thereafter, a gate insulation film 25 is formed, a gate electrode 24 and a side-wall insulation film 26 are formed, and further, source-drain regions 27 are formed.

Figure 3F:
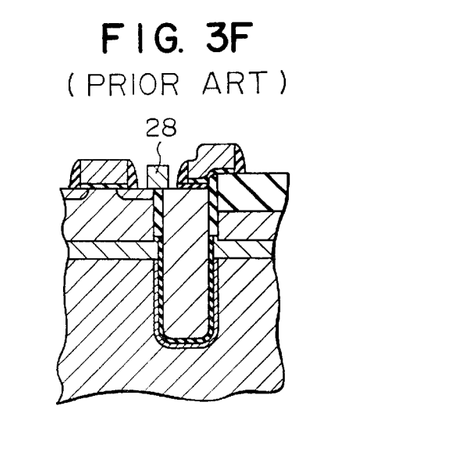

Subsequently, as shown in FIG. 3F, an electrode 28 is formed on the silicon oxide film 15.

Figure 10:
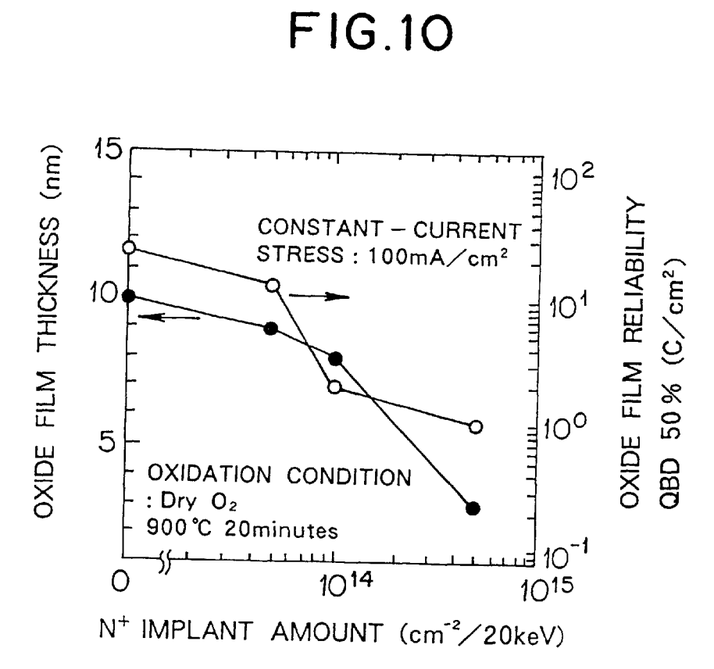
FIG. 10 is a graph showing the relationship between the oxide film thickness and the oxide film reliability (QBD) in the case oxidation has been carried out after the implantation of nitrogen into a silicon substrate.

On the other hand, in Patent Application Laid-Open No. 7-94503, there is disclosed a method according to which, before oxidizing the substrate surface, an impurity is implanted into a silicon substrate to control the thickness of the oxide film. More specifically, according to the method disclosed in this Patent Application Laid-Open No. 7-94503, nitrogen ions and argon ions are implanted into the silicon substrate, and thereafter, the surface of the silicon substrate is thermally oxidized, whereby the oxidation rate is controlled. As shown in FIG. 10, if the amount of the impurity implanted into the silicon substrate is increased, then the thickness of the resulting oxide film can be changed.

The gate insulation film 30 of a field-effect transistor using a trench isolation structure (See FIGS. 1A to 1E) has no bird's beak, and, during the oxidation, oxygen is not uniformly fed from the surface of the silicon substrate, and thus, the portion of the gate insulation film which lies in the vicinity of the end of the trench isolation portion becomes thin. As a result, the breakdown voltage of the oxide film in the vicinity of the end of the trench isolation portion is deteriorated as compared with that of the expected oxide film thickness, thereby the reliability of the oxide film being deteriorated.

In case the element separation portion is formed by the use of the LOCOS (LOCAL OXIDATION OF SILICON) based on thermal oxidation (See FIGS. 2A to 2D), the thickness of that portion of the gate insulation film 33 which lies in the vicinity of the end of the element separation portion becomes greater than the center portion of the gate insulation film due to the bird's beak (the end of the silicon oxide film 31) and never become smaller than the thickness of the design-wise expected insulation film thickness. As a result, the breakdown voltage of the insulation film does not become worse than the breakdown voltage of the insulation film with an expected thickness. However, in case a field-effect transistor is more microstructured, it becomes difficult to form a narrow element region 32 due to the bird's beak.

Further, in a trench DRAM cell (see FIGS. 3A to 3F), in the case of isolating the storage electrode 22 comprising silicon which contains an impurity from the gate electrode 24 of the transfer gate of the adjacent cell, the upper portion of the storage electrode made of the silicon film 22 is oxidized to form the silicon oxide film 34 (See FIG. 3D). In this case, oxygen is not uniformly fed, and thus, the thickness of that portion of the oxide film 34 which lies in the vicinity of the end of the element separation portion becomes thin. As a result, the isolation breakdown voltage become worse as compared with the reliability of the expected oxide film thickness.

On the other hand, in the case of the method according to which, before the oxidation is performed, an impurity is implanted into the silicon substrate to thereby control the oxide film thickness (Patent Application Laid-Open No. 7-94503), if the amount of the impurity implanted into the silicon substrate is increased, then the quality of the resulting oxide film is deteriorated and thus cannot be used under a high-density condition as described in the above-mentioned Patent Application Laid-Open No. 7-94503.

SUMMARY OF THE INVENTION

It is the object of the present invention to provide a field-effect transistor with a trench structure having an insulation film which does not deteriorate the insulation breakdown voltage and a method for the manufacturing the same.

Another object of the present invention is to provide a method for forming a field insulation film formed by the use of the LOCOS method which suppresses a bird's beak.

Still another object of the present invention is to provide a method for forming an insulation film which does not deteriorate the insulation breakdown voltage for isolating the storage electrode of a trench DRAM cell from the gate electrode of the transfer gate of the adjacent cell.

The field-effect transistor with a trench isolation structure according to the present invention is characterized in that the thickness of that portion of a gate insulation film which lies in the vicinity of the end portion of a trench isolation portion is equal to or greater than the thickness of the center portion of the gate insulation film.

The method for manufacturing the gate insulation film of a field-effect transistor with a trench isolation portion according to the present invention comprises the steps of; forming first mask insulation films for trench etching; performing the trench etching; implanting argon, boron, phosphorus or silicon, forming a first insulation film for trench isolation in a state buried in the trench; forming a gate insulation film after the first mask insulation films are removed; forming a gate electrode; and forming a contact and a wiring.

The present invention further provides a method for manufacturing the gate insulation film of a field-effect transistor with a trench isolation portion. The method comprises the steps of; forming first mask insulation films for trench etching; performing trench etching; forming a first insulation film for trench isolation in a state buried in the trench; removing the first mask insulation films; forming a second insulation film on the side wall of the trench isolation portion; implanting nitrogen; removing the second insulation film on the side wall of the trench isolation portion; forming gate insulation film and a gate electrode; and forming a contact and a wiring.

The present invention further provides a method for manufacturing a field-effect transistor with a field insulation film, which method comprises the steps of; forming first mask insulation films for the formation of a field insulation film; implanting nitrogen; performing thermal oxidation to form a field insulation film; removing the first mask insulation films; forming a gate insulation film and a gate electrode; and forming a contact and a wiring.

The present invention further provides a method for manufacturing a trench DRAM cell, which method comprises the steps of forming a second mask insulation films for trench etching; forming a substrate-side capacitance electrode and a capacitance insulation film; depositing silicon which contains an impurity; etching back the silicon; ion-implanting argon, boron, phosphorus or silicon obliquely into the substrate; oxidizing the silicon to form a third insulation film; removing the second mask insulation films; forming the gate electrode and the source-drain regions of a transfer gate; forming an electrode for connecting the drain region of the transfer gate to the silicon; and forming a contact and a wiring.

The present invention further provides a method for manufacturing a trench DRAM cell, which method comprises the steps of forming second mask insulation films for trench etching; forming a substrate-side capacitance electrode and a capacitance insulation film; depositing silicon which contains an impurity; etching back the silicon; forming a fourth insulation film on the side wall of an insulation film of the second mask; ion-implanting nitrogen; removing the insulation film of the second mask and the fourth insulation film; oxidizing the silicon to form a third insulation film; forming the gate electrode and the source-drain regions of a transfer gate; forming an electrode for connecting the drain region of the transfer gate and the silicon to each other; and forming a contact and a wiring.

According to the present invention, in case the insulation film for isolating the gate insulation film of the field-effect transistor which has been formed by thermal oxidation or the gate electrode of the transfer gate of a trench DRAM cell is isolated from the storage electrode is formed, an impurity for enhancing the oxidation rate is implanted to the region in the vicinity of the end of a pattern or an impurity for lowering the oxidation rate is implanted into the region other than the region in the vicinity of the pattern end, so that the thickness of that portion of the insulation film which lies in the vicinity of the pattern end becomes equal to or greater than the thickness of the center portion of the insulation film, whereby an insulation film with an excellent insulation breakdown voltage can be formed. Further, in the case of forming the field insulation film by thermal oxidation, an impurity for lowering the oxidation rate is implanted into the region in which a bird's beak is formed, whereby a field insulation film with a less bird's beak can be formed.

DETAILED DESCRIPTION OF THE PREFERRED EMBODIMENTS

Figure 4:
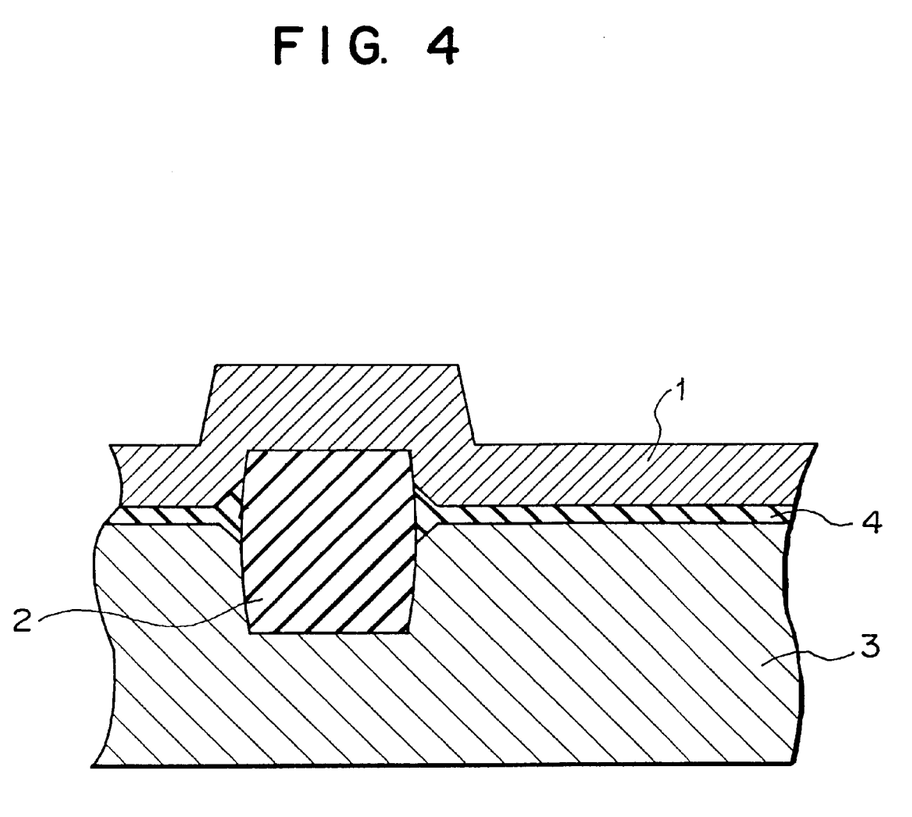
FIGS. 4 is a sectional view showing the structure of the gate insulation film of a field-effect transistor with the trench isolation structure according to an embodiment of the present invention.

Embodiments of the present invention will now be described by reference to the accompanying drawings. FIG. 4 is a sectional view showing the structure of a field-effect transistor with the trench isolation structure according to a first embodiment of the present invention. On a silicon substrate 3, a gate insulation film 4 is formed, and further, a gate electrode 1 is formed, and, in the surface of the substrate, a trench isolation portion 2 is formed. In this embodiment, the thickness of the portion in the vicinity of that end of the gate insulation film 4 which is adjacent to the trench isolation portion 2 is equal to or greater than by a maximum of 15% than the thickness of the center portion of the gate insulation film 4, so that the gate insulation film's breakdown voltage at the end of the gate electrode is not deteriorated. Further, since the trench is rounded, the concentration of electric field on the edge of the trench can be prevented.

Figure 5A:
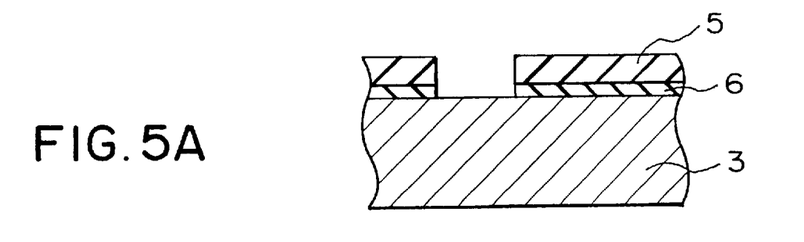
FIGS. 5A to 5E are sectional views showing, in the order of manufacturing steps, the method for manufacturing a field-effect transistor with the trench isolation structure according to a first embodiment of the present invention.

FIGS. 5A to 5E are sectional views showing, in the order of manufacturing steps, the method for manufacturing a field-effect transistor with the trench isolation structure according to the first embodiment of the present invention. As shown in FIG. 5A, a first mask insulation film consisting of a silicon nitride film 5 and a silicon oxide film 6 is formed on a silicon substrate 3 for trench etching.

Figure 5B:
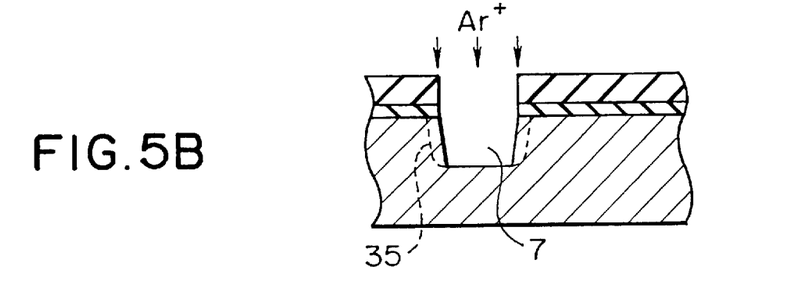

Subsequently, as shown in FIG. 5B, dry etching is carried out to form a trench 7, and thereafter, argon, boron, phosphorus or silicon are ion-implanted under the condition that the amount of the impurity implanted be $1\times10^{13}$ to $1\times10^{15}$ cm$^{-2}$, the acceleration energy be 10 to 80 keV, the angle of implantation be 0 to 45 degrees, whereby an impurity region 35 is formed in the portion of the silicon substrate 3 which constitute the side surface of the trench 7.

Figure 5C:
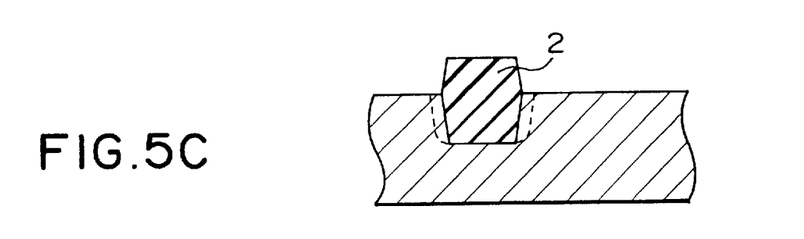

Next, as shown in FIG. 5C, a trench isolation portion 2 as a first insulation film is formed in a state buried in the trench 7 for trench isolation, and the silicon nitride film 5 and the silicon oxide film 6 as the first mask insulation film are removed.

Figure 5D:
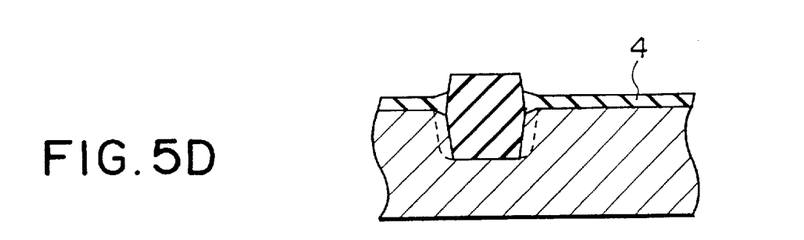

Thereafter, as shown in FIG. 5D, a gate insulation film 4 having a thickness of 2 to 50 nm is formed by thermal oxidation.

Figure 5E:
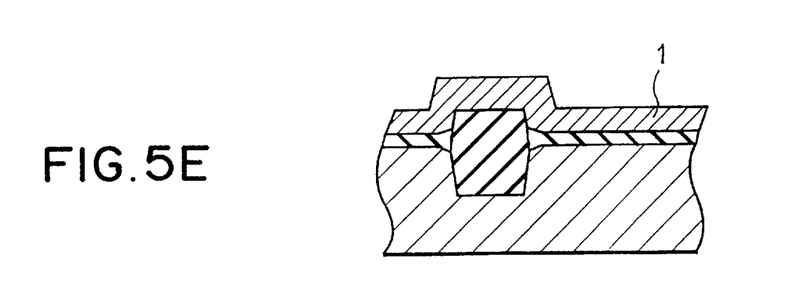
Figure 11:
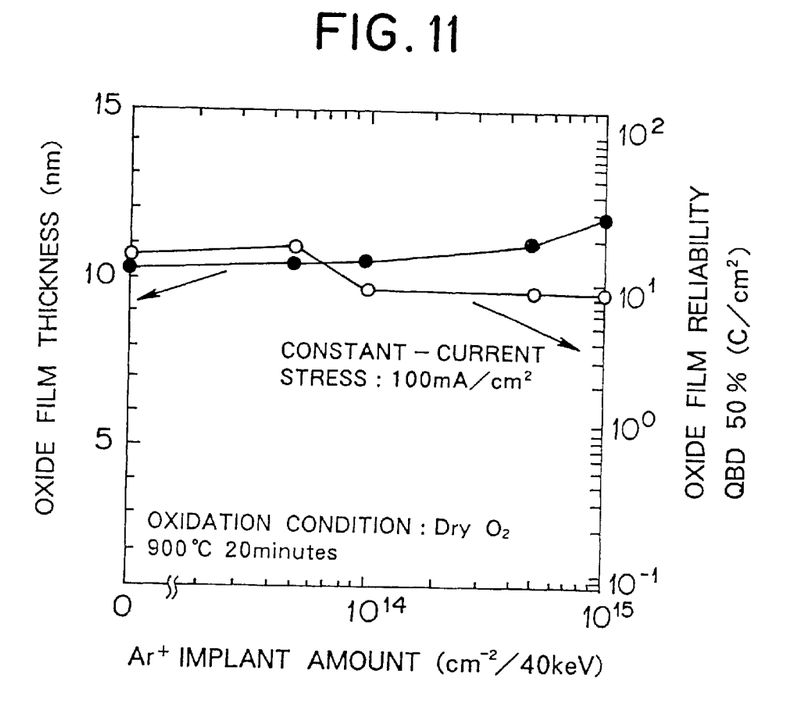
FIG. 11 is a graph showing the relationship between the oxide film thickness and the oxide film reliability (QBD) in case the oxidation has been carried out after the implantation of Ar+ into the silicon substrate.

Finally, as shown in FIG. 5E, a gate electrode film 1, a contact and a wiring are form, whereby the formation of a field-effect transistor is formed. When oxidation is performed for the formation of the gate insulation film 4, the thickness of that portion of the gate insulation film 4 which lies in the vicinity of the trench isolation portion 2 ordinarily becomes thin due to the fact that the amount of oxygen fed is small, but, in this embodiment, an impurity such as, e.g., argon for promoting oxidation has been implanted into only the portion of the silicon substrate which lies in the vicinity of the trench isolation portion 2 (the impurity region 35 in FIG. 5B), so that the thickness of that portion of the gate insulation film portion which lies in the vicinity of the trench isolation portion becomes equal to or greater by a maximum of 15% than the thickness of the center portion of the gate insulation film 4 (FIG. 11). As a result, the deterioration of the insulation film's breakdown voltage at the end of the gate electrode due to the fact that the thickness of that portion of the gate insulation film becomes thin, can be prevented. The gate insulation film 4 comprises a silicon oxide film formed by thermal oxidation, but even if a silicon nitride film formed by thermal nitriding or the like is used or even if both of a silicon nitride film and a silicon oxide film are used, the same effect can be obtained. By setting the amount of the above-mentioned impurity such as argon implanted to $1\times10^{13}$ to $1\times10^{15}$ cm$^{-2}$, the deterioration of the insulation film due to the implantation of the impurity is caused very little as shown in FIG. 11.

Figure 6A:
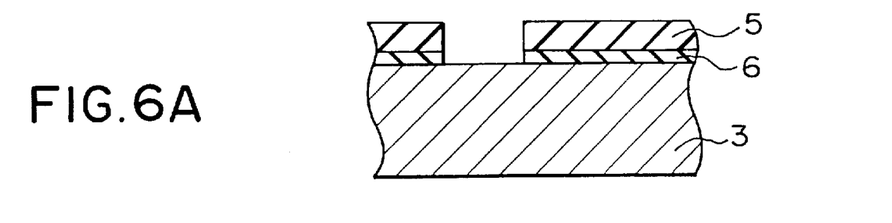
FIGS. 6A to 6E are sectional views showing, in the order of manufacturing steps, the method for manufacturing a field-effect transistor with the trench isolation structure according to a second embodiment of the present invention.

Next, the method for manufacturing a field-effect transistor with the trench isolation structure according to a second embodiment of the present invention will be described. FIGS. 6A to 6E are sectional views showing, in the order of manufacturing steps, the manufacturing method according to the second embodiment. First, as shown in FIG. 6A, a first mask insulation film consisting of a silicon nitride film 5 and a silicon oxide film 6 is formed for trench etching.

Figure 6B:
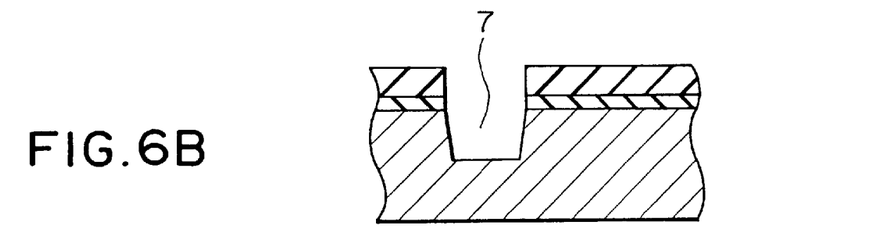

Subsequently, as shown in FIG. 6B, a trench 7 is formed.

Figure 6C:
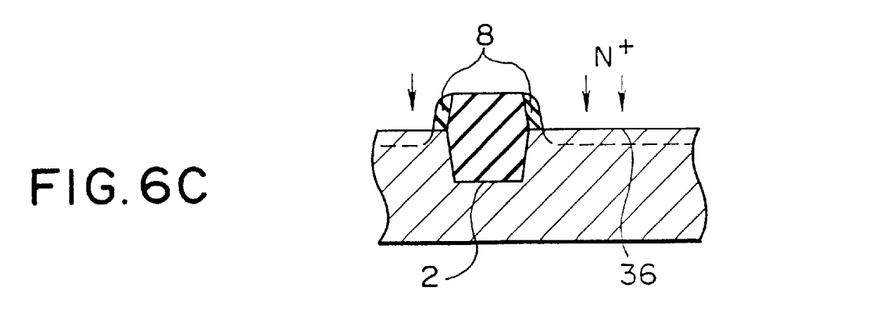

Thereafter, as shown in FIG. 6C, a trench isolation portion 2 as a first insulation film is formed in a state buried in the trench 7 for trench isolation, and the first mask insulation films 5 and 6 are removed. Thereafter, a second insulation film (side-wall insulation film 8) formed of a silicon nitride film is formed, by the CVD method or by means of etch back, with a width of 0.1 μm or less.

Next, nitrogen is ion-implanted under the condition that the amount of nitrogen implanted be $1\times10^{13}$ to $5\times10^{13}$ cm$^{-2}$, the acceleration energy be 10 to 80 keV, and the angle of implantation be 0 degree, whereby an impurity region 36 is formed in the silicon substrate 3.

Figure 6D:
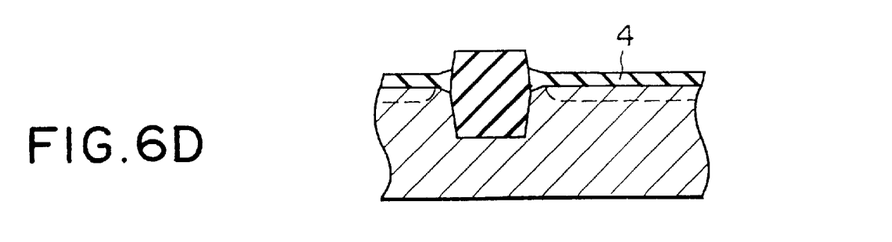

Thereafter, as shown in FIG. 6D, the side-wall insulation film 8 as the second insulation film is removed, and thereafter, a gate insulation film 4 with a thickness of 2 to 50 nm is formed by thermal oxidation.

Figure 6E:
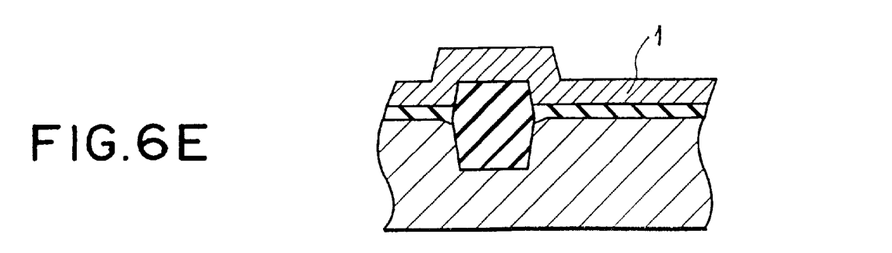

Finally, as shown in FIG. 6E, a gate electrode film 1, a contact and a wiring are formed, whereby a field-effect transistor is formed.

When oxidation is performed for the formation of the gate insulation film 4, the thickness of that portion of the gate insulation film 4 which lies in the vicinity of the trench isolation portion 2 becomes equal to or greater by a maximum of 10% than the thickness of the center portion of the gate insulation film 4 (See FIG. 10), since nitrogen for suppressing the oxidation has been implanted into only the center portion of the gate insulation film 4 to form an impurity region 36 (See FIG. 6C).

As a result, the deterioration of the insulation film's breakdown voltage due to the thickness of that portion of the insulation film which lies at the end of the gate electrode becomes thin, can be prevented. Further, by setting the amount of the above-mentioned nitrogen implanted to the range of from $1\times10^{13}$ to $5\times10^{13}$ cm$^{-2}$, the deterioration of the insulation film due to the implantation of the impurity can be suppressed to a degree which does not matter. By using the above mentioned first and second manufacturing methods at the same time, it is possible to cause a difference between the oxidation rate in the end portion of the gate insulation film 4 and the oxidation rate in the center portion of the gate insulation film 4.

Next, the method for manufacturing a field-effect transistor having a field insulation film formed by the use of LOCOS method according to an embodiment of the present invention will be described by reference to the symbolic sectional views shown in FIGS. 7A to 7E. First, as shown in FIG. 7A, a first mask insulation film consisting of a silicon nitride film 5 and a silicon oxide film 6 is formed for forming a field insulation film by the use of the LOCOS method.

Figures 7A, 7B:
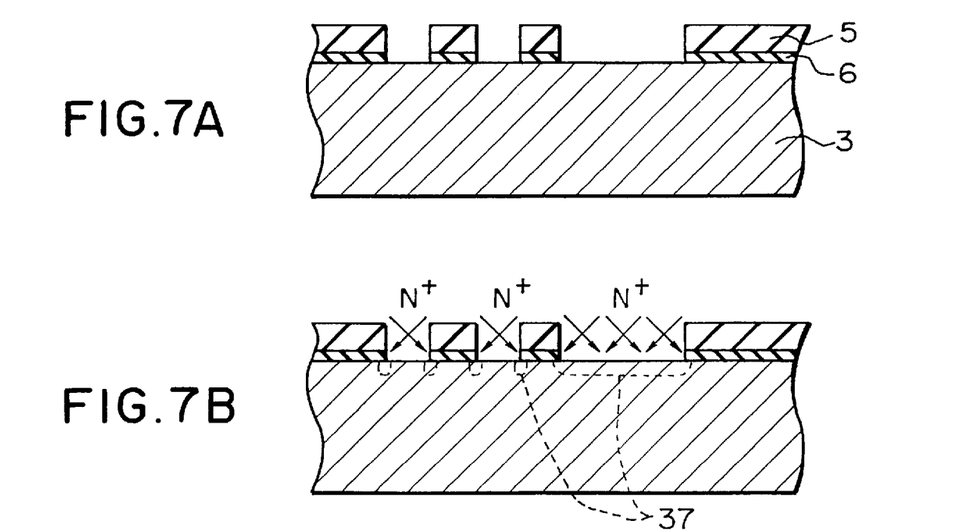
FIGS. 7A to 7E are sectional views showing, in the order of manufacturing steps, the method for manufacturing a field-effect transistor with the field insulation film formed by the use of the LOCOS method according to a third embodiment of the present invention.

Next, as shown in FIG. 7B, nitrogen is ion-implanted under the condition that the amount of nitrogen implanted be $1\times10^{13}$ to $1\times10^{14}$ cm$^{-2}$, the acceleration energy be 10 to 80 keV, and the angle of implantation be 5 to 45 degrees, whereby an impurity region 37 is formed.

Figure 7C:
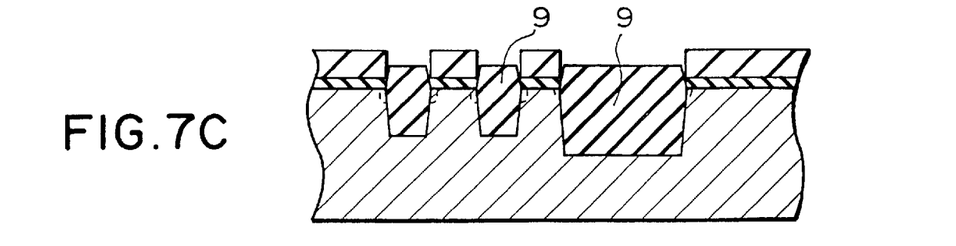

Next, as shown in FIG. 7C, thermal oxidation is performed to form a field insulation film 9.

Figure 7D:
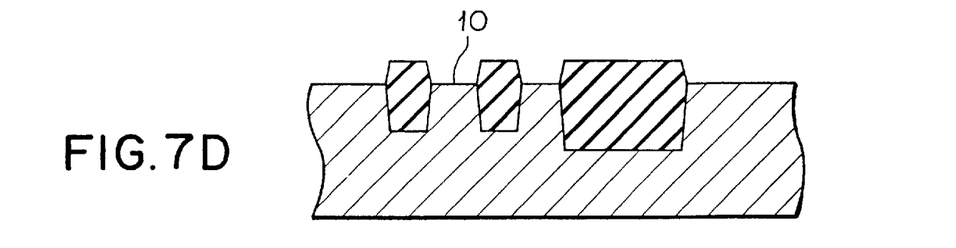
Figure 7E:
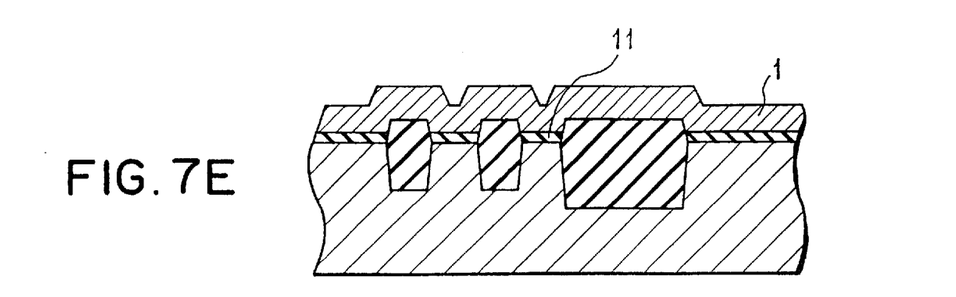

Further, as shown in FIG. 7D, the first mask insulation films 5 and 6 are removed, and thereafter, as shown in FIG. 7E, a gate insulation film 11 is formed by thermal oxidation to a thickness of 2 to 50 nm. Finally, a gate electrode film 1, a contact and a wiring are formed, whereby a field-effect transistor is formed.

When oxidation is performed to form the field insulation film 9, nitrogen for suppressing the oxidation speed is obliquely implanted by the use of the first mask insulation films, so that, in the narrow portions of element regions 10, the nitrogen is implanted into only those portions of the silicon substrate which lie in the vicinities of the ends of the first mask insulation films, whereby impurity regions 37 are formed (See FIG. 7B). As a result, a bird's beak is not formed beneath the first mask insulation films, so that the narrow element regions 10 can be easily formed. In the center portion of the narrow portion of the respective element region 10, no nitrogen is implanted, so that a thick oxide film is formed as the field insulation film 9. In the wide portion of the respective element region 10, the thick oxide film of the field insulation film 9 grows since a sufficient amount of oxygen is fed from the surface of the silicon substrate. However, the amount of nitrogen implanted is set to a maximum of $1\times10^{14}$ cm$^{-2}$; if a more amount of nitrogen is implanted, an oxide film sufficiently thick for element separation cannot be grown. Further, even if a bird's beak (field insulation film 9) containing nitrogen is produced, it is a thin oxide film, which can be easily removed, so that it does not matter to the reliability.

Figure 8A:
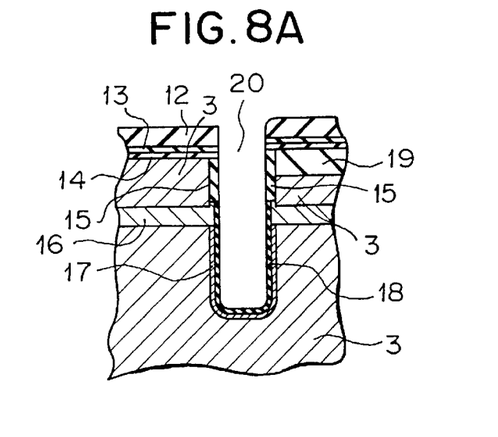
FIGS. 8A to 8F are sectional views showing, in the order of manufacturing steps, the method for forming the trench cell structure according to a fourth embodiment of the present invention.

Next, the method for manufacturing a trench DRAM cell according to an embodiment of the present invention will be described referring to the symbolic sectional views shown in FIG. 8A to 8F in the order of the manufacturing steps thereof. As shown in FIG. 8A, second mask insulation films for the formation of a trench, which films consist of a silicon oxide film 12 with a thickness of 100 to 800 nm, a silicon nitride film 13 with a thickness of 10 to 100 nm and a silicon oxide film 14 with a thickness of 10 to 20 nm, are formed, and thereafter, an impurity layer which is a substrate-side capacitance electrode 17 and silicon oxide/nitride films which is a capacitance insulation film 18 are formed.

Figure 8B:
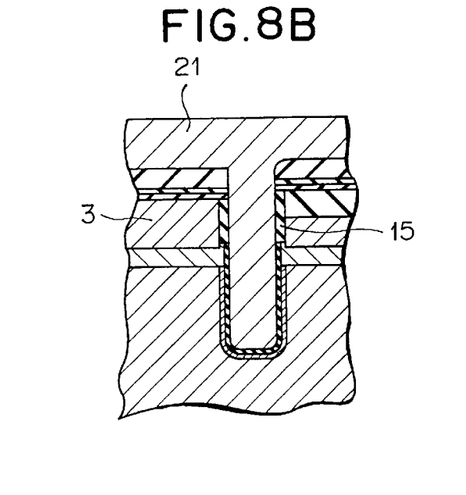

Next, as shown in 8B, a silicon film 21 containing 0.1 to $3\times10^{20}$ cm$^{-3}$ Of phosphorus is deposited on the whole substrate surface.

Figure 8C:
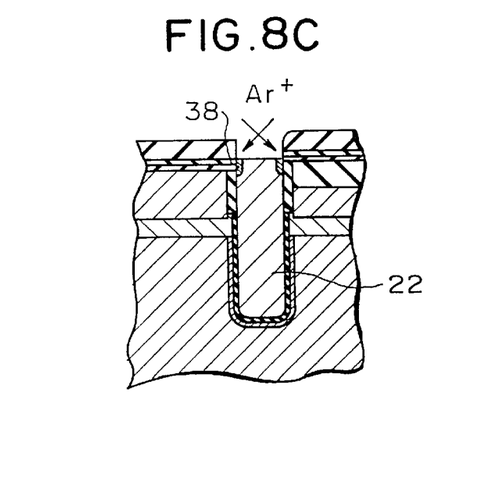

Thereafter, as shown in FIG. 8C, the silicon film 21 is etched back to make the surface of a silicon film 22 flush with the silicon nitride film 13, and thereafter, argon, boron, phosphorus or silicon is ion-implanted under the condition that the amount of the impurity implanted be $1\times10^{13}$ to $1\times10^{15}$ cm$^{-2}$, the acceleration energy be 10 to 80 keV, and the angle of implantation be 5 to 45 degrees, whereby an impurity region 38 is formed.

Figure 8D:
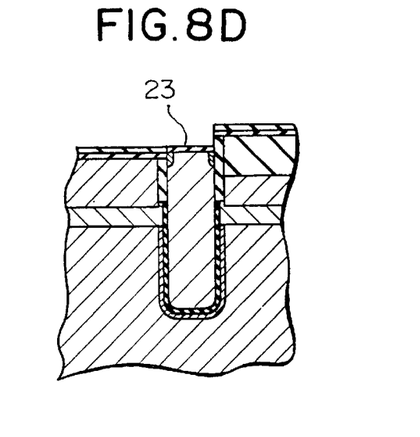

Subsequently, as shown in FIG. 8D, the silicon oxide film 12 which is one of the second mask insulation films is removed, and thereafter, by the thermal oxidation of the surface of a silicon film 22, a third insulation film comprising a silicon oxide film 23 which has a thickness of 10 to 100 nm is formed.

Figure 8E:
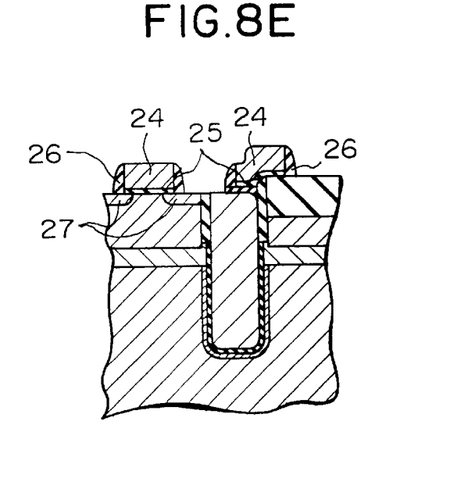

Subsequently, as shown in FIG. 8E, the silicon nitride film 13 and the silicon oxide film 14 which are insulation films of the second mask are removed, and thereafter, a gate insulation film 25, a gate electrode 24, a side-wall insulation film 26 and source-drain regions 27 of a transfer gate are formed.

Figure 8F:
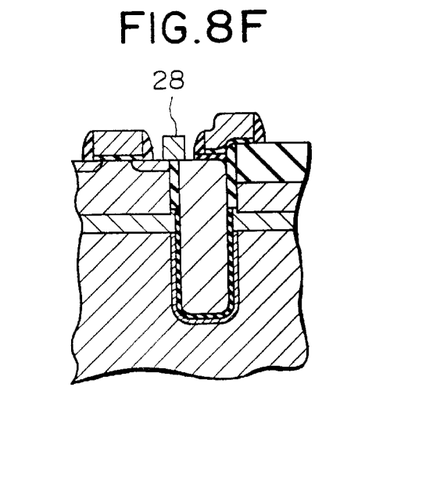

Thereafter, as shown in FIG. 8F, a capacitance electrode 28 is formed so as to be connected to the source-drain regions 27 of the transfer gate. Further, a contact and a wiring are formed, whereby a DRAM cell is formed.

An impurity such as, e.g., argon for promoting oxidation is obliquely implanted by the use of the second mask oxide films (the silicon oxide film 12, the silicon nitride film 13, and the silicon oxide film 14) as a mask so as to be implanted into only the region in the vicinity of the field insulation film 19, whereby the impurity region 38 is formed (See FIG. 8C). When oxidation is performed for the formation of the silicon oxide film 23 as the third insulation film, the thickness of that portion of the silicon oxide film 23 which lies in the vicinity of the field insulation film 19 becomes equal to or greater by a maximum of 15% than the thickness of the center portion of the oxide insulation film 23. As a result, the deterioration of the breakdown voltage of the insulation film due to the fact that the insulation film becomes thin at the end of the gate electrode, can be prevented.

Figure 9A:
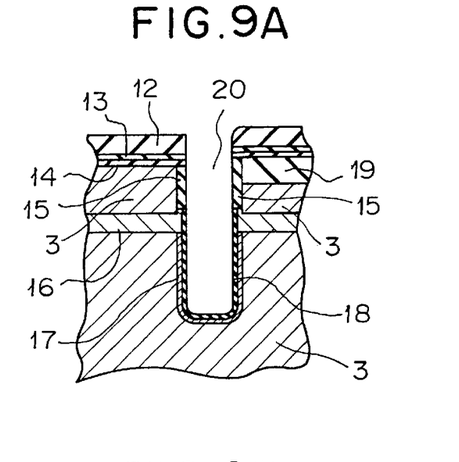
FIGS. 9A to 9F are sectional views showing, in the order of manufacturing steps, the method for forming the trench ell structure according to a fifth embodiment of the present invention.

Next, the method for manufacturing a trench DRAM cell according to an embodiment of the present invention will be described. FIGS. 9A to 9F are symbolic sectional views showing this manufacturing method in the order of the manufacturing steps thereof. As shown in FIG. 9A, second mask insulation films for the formation of a trench, which films consist of a silicon oxide film 12 with a thickness of 100 to 800 nm, a silicon nitride film 13 with a thickness of 10 to 100 nm and a silicon oxide film 14 with a thickness of 10 to 20 nm, are formed, and thereafter, an impurity layer which is a substrate-side capacitance electrode 17 and a capacitance insulation film 18 comprising silicon oxide/nitride films are formed.

Figure 9B:
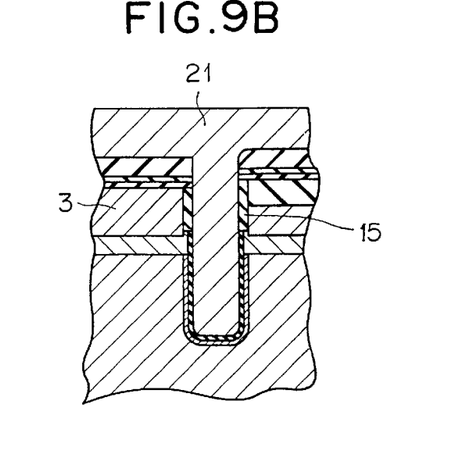

Next, as shown in 9B, a silicon film 21 containing $0.1 \times 10^{20}$ to $3 \times 10^{20}$ cm$^{-3}$ of phosphorus is deposited on the whole substrate surface.

Figure 9C:
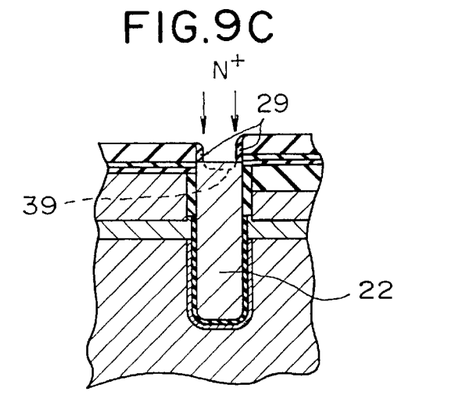

Next, as shown in FIG. 9C, the silicon film 21 is etched back to make the surface of the silicon film 21 flush with the silicon oxide film 13, and thereafter, a fourth insulation film formed of a silicon oxide film with a width of 0.1 $\mu$m or less is formed on the side wall of the second mask insulation film the silicon oxide film 12.

Next, nitrogen is ion-implanted under the condition that the amount of nitrogen implanted be $1 \times 10^{13}$ to $5 \times 10^{13}$ cm$^{-2}$, the acceleration energy be 10 to 80 keV, and the angle of implantation be 0 degree, whereby an impurity region 39 is formed on the side wall of the silicon oxide film 12, using a fourth insulation film 29 as a mask.

Figure 9D:
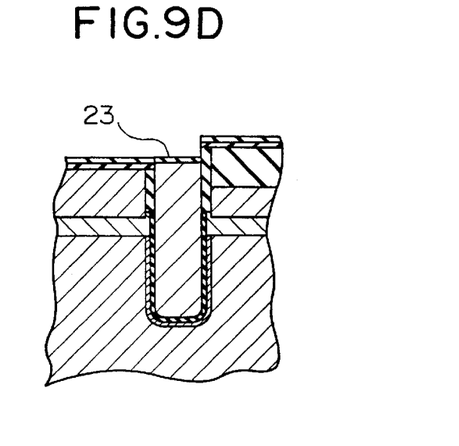

Next, as shown in FIG. 9D, the silicon oxide film 12 which is one of the second mask insulation films and the silicon oxide film 29 which is one of the fourth insulation films are removed, and thereafter, by thermal oxidation, a silicon oxide film as 23 the third insulation film comprising a silicon oxide film which has a thickness of 10 to 100 nm is formed.

Figure 9E:
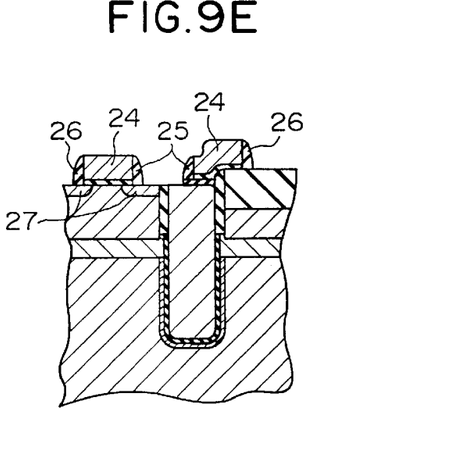

Thereafter, as shown in FIG. 9E, the silicon nitride film 13 and the silicon oxide film 14 which are insulation films of the second mask are removed, and thereafter, a gate insulation film 25, a gate electrode 24, a side-wall insulation film 26 and source-drain regions 27 of a transfer gate are formed.

Figure 9F:
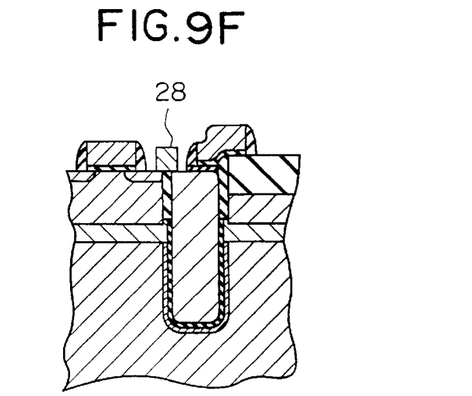

Next, as shown in FIG. 9F, a capacitance electrode 28 is formed so as to be connected to the source-drain regions 27 of the transfer gate. Further, a contact and a wiring are formed, whereby a DRAM cell is formed.

When oxidation is performed for the formation of the silicon oxide film 23 as the third insulation film, an impurity such as, e.g., nitrogen for suppressing oxidation is implanted into only the center portion of the silicon film 22 to form the impurity region 39 (See FIG. 9C). Therefor, the thickness of the end portion of the silicon oxide film 23 is equal to or greater by a maximum of 15% than the thickness of the center portion of the silicon oxide film 23. As a result, the deterioration of the breakdown voltage of the insulation film due to the fact that the insulation film becomes thin in the end portion of the gate electrode can be prevented.

According to the present invention, in the case of forming the insulation film by thermal oxidation, an impurity for enhancing the oxidation rate is implanted to the region in the vicinity of the end of the pattern. Or an impurity for lowering the oxidation rate is implanted into the region other than the pattern end. Therefor, the thickness of that portion of the insulation film which lies in the vicinity of the pattern end is equal to or greater than the thickness of the center portion of the insulation film. Thus, an insulation film can be formed, which does not result in the deterioration of the insulation breakdown voltage in the vicinity of the pattern end. Further, in a field-effect transistor having a trench isolation portion, the edge of the trench is rounded, so that the concentration of electric field on the trench edge can be prevented. Moreover, in case the field insulation film is formed by thermal oxidation, an impurity for lowering the oxidation rate is implanted into the region in which a bird's beak is produced, so that a field insulation film with a less bird's beak can be formed.

Figure 12A:
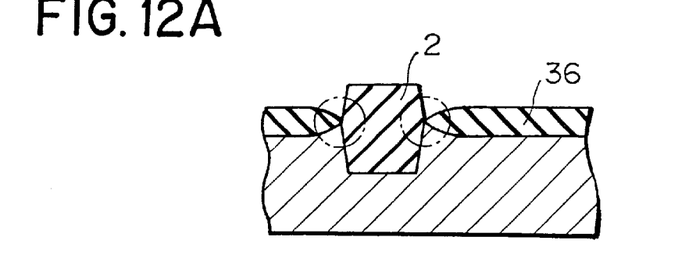
FIGS. 12A to 12D are sectional views showing the advantages of the present invention relative to the conventional methods.

FIGS. 12A to 12D are sectional views showing the advantages of the present invention relative to the conventional methods. FIG. 12A corresponds to FIG. 1D which shows the conventional transistor and emphasizes the disadvantage of it. A part of the thermal oxide film 30 which contacts to the insulation film 2 for trench isolation is thinner than the bulk portion of the oxide film 30. At that part, the breakdown voltage is degraded.

Figure 12B:
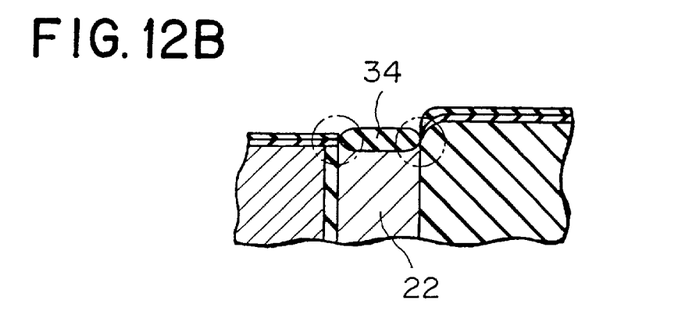

FIG. 12B corresponds to FIG. 3D of the conventional transistor and emphasizes the oxide film 34. In this case, the edge of the oxide film 34 is also thinner than the bulk portion of it. Therefor, the breakdown voltage is lowered in this conventional transistor.

Figure 12C:
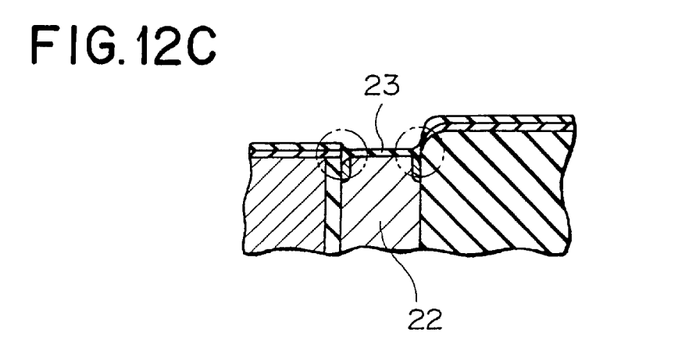

FIG. 12C corresponds to FIG. 8D which shows the embodiment of the present invention. Also, FIG. 12C emphasizes the thickness of the silicon oxide film 23 as the third insulation film. The edge of the silicon oxide film 23 is thicker than or equal to the bulk portion of it. Therefor, the breakdown voltage is prevented from being lowed.

Figure 12D:
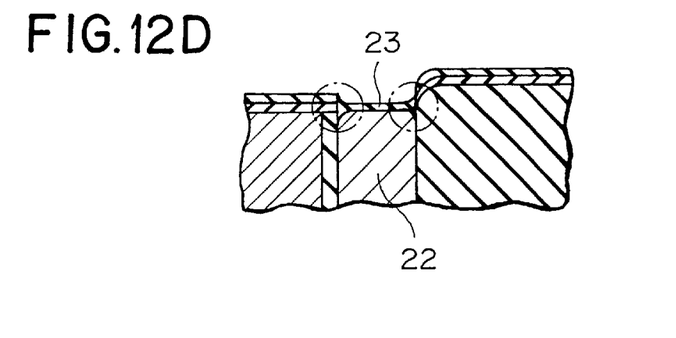

FIG. 12D corresponds to FIG. 9D which shows the embodiment of the present invention. The thickness of the edge of the insulation film 23 is also larger than or equal to bulk portion. Therefor, the breakdown voltage is prevented from being degraded.

What is claimed is:

1. A method of stabilizing a thickness of a gate insulation film in a field-effect transistor having a trench isolation structure, comprising the steps of:

forming a masking film on a surface of a substrate;

etching a trench into the substrate using the masking film as a mask;

forming an impurity region in sidewalls of the trench by implanting an impurity that is one of argon, boron, phosphorus, and silicon directly into the sidewalls of the trench;

removing the masking film;

filling the trench with an insulator;

forming a gate insulation film on the substrate; and migrating the impurity in the sidewalls of the trench into the gate insulation film adjacent to the sidewalls of the trench, thereby relatively stabilizing a thickness of the gate insulation film adjacent to the sidewalls of the trench to be generally no less than a thickness of the gate insulation film not adjacent to the sidewalls of the trench, the step of forming the impurity region comprising the step of selecting an implant dose of the impurity so that the thickness of the gate insulation layer adjacent to the sidewalls of the trench is no greater than 115% of the thickness of the gate insulation layer not adjacent to the sidewalls of the trench.

2. The method of claim 1, wherein the step of forming the masking film comprises the steps of forming a silicon oxide film on the substrate and a silicon nitride film on the silicon oxide film.

3. The method of claim 1, wherein the step of forming the impurity region comprises the step of implanting the impurity with an acceleration energy of 10 to 80 keV, at an angle of 0 to 450°, and at an amount of $1 \times 10^3$ to $1 \times 10^{15}$ atoms/cm².

4. A method of stabilizing a thickness of a gate insulation film in a field-effect transistor having a trench isolation structure, comprising the steps of:

forming a masking film on a surface of a substrate;

etching a trench into the substrate using the masking film as a mask;

removing the masking film;

filling the trench with an insulator so that a portion of the insulator extends above the surface of the substrate;

forming sidewalls at sides of the insulator that extend above the surface of the substrate;

forming an impurity region in the surface of the substrate by implanting nitrogen into the surface of the substrate, the sidewalls preventing nitrogen implantation adjacent to the insulator;

removing the sidewalls;

forming a gate insulation film on the substrate; and migrating the impurity in the surface of the substrate into the gate insulation film that is not adjacent to the insulator, thereby relatively stabilizing a thickness of the gate insulation film adjacent to the insulator to be generally no less than a thickness of the gate insulation film not adjacent to the sidewalls of the trench, the step of forming the impurity region comprising the step of selecting an implant dose of the impurity so that the thickness of the gate insulation layer adjacent to the sidewalls of the trench is no greater than 110% of the thickness of the gate insulation layer not adjacent to the sidewalls of the trench.

5. The method of claim 4, wherein the step of forming the masking film comprises the steps of forming a silicon oxide film on the substrate and a silicon nitride film on the silicon oxide film.

6. The method of claim 4, wherein the step of forming the impurity region comprises the step of implanting the impurity with an acceleration energy of 10 to 80 keV, at an angle of 0°, and at an amount of $1 \times 10^{13}$ to $5 \times 10^{13}$ atoms/cm².

* * * * *